(12) United States Patent
Xu

(10) Patent No.: US 8,951,132 B2
(45) Date of Patent: Feb. 10, 2015

(54) CHILDREN'S ROCKER

(71) Applicant: Kids II, Inc., Atlanta, GA (US)

(72) Inventor: Qing Xu, Shanghai (CN)

(73) Assignee: Kids II, Inc., Atlanta, GA (US)

( * ) Notice: Subject to any disclaimer, the term of this patent is extended or adjusted under 35 U.S.C. 154(b) by 0 days.

(21) Appl. No.: 13/764,438

(22) Filed: Feb. 11, 2013

(65) Prior Publication Data

US 2013/0154324 A1 Jun. 20, 2013

Related U.S. Application Data

(63) Continuation of application No. 13/532,130, filed on Jun. 25, 2012, now abandoned.

(60) Provisional application No. 61/500,652, filed on Jun. 24, 2011.

(51) Int. Cl.

| *A63G 13/06* | (2006.01) |
|---|---|
| *C08K 9/02* | (2006.01) |
| *A47D 13/10* | (2006.01) |
| *H01G 11/36* | (2013.01) |
| *C09C 1/44* | (2006.01) |
| *H01L 31/0352* | (2006.01) |

(Continued)

(52) U.S. Cl.
CPC . *C08K 9/02* (2013.01); *A47D 13/10* (2013.01); *H01G 11/36* (2013.01); *C09C 1/44* (2013.01); *H01L 31/035218* (2013.01); *C04B 35/62839* (2013.01); *C04B 35/62889* (2013.01); *C04B 35/62892* (2013.01); *C04B 40/0039* (2013.01); *C01B 31/0273* (2013.01); *C01B 31/0484* (2013.01); *B01J 37/0236* (2013.01); *B01J 37/343* (2013.01); *B01J 21/185* (2013.01); *B01J 35/06* (2013.01); *B01J 37/0201* (2013.01); *C01P 2004/04* (2013.01); *C01P 2004/13* (2013.01); *C01P 2004/24* (2013.01); *C01P 2004/54* (2013.01); *C04B 2235/3203* (2013.01); *C04B 2235/3244* (2013.01); *C04B 2235/3272* (2013.01); *C04B 2235/425* (2013.01); *C04B 2235/447* (2013.01); *C04B 2235/5288* (2013.01); *C04B 2235/5292* (2013.01); *Y02E 60/13* (2013.01); *B01J 37/0018* (2013.01); *B01J 37/009* (2013.01)
USPC ............................. 472/102; 472/103; 446/29

(58) Field of Classification Search
CPC ......... A63G 9/00; A63G 11/00; A63G 13/06; A63G 13/08; A63G 23/00
USPC ............... 472/92, 102–105, 114; 446/29, 396
See application file for complete search history.

(56) References Cited

U.S. PATENT DOCUMENTS

| D171,458 S * | 2/1954 | Peltier ............................ D6/347 |
| 2,707,633 A * | 5/1955 | Wiley et al. ................... 472/102 |

(Continued)

*Primary Examiner* — Kien Nguyen
(74) *Attorney, Agent, or Firm* — Alston & Bird LLP

(57) ABSTRACT

Various embodiments of the present invention are directed to a children's rocker adapted for providing simultaneous rocking and swinging motion for a child positioned therein. According to various embodiments, the children's rocker generally comprises a frame configured for rocking movement on a support surface and a child support suspended from the frame by one or more attachment members. In various embodiments, the attachment members are generally configured to permit the child support to swing along an arcuate path relative to the frame. In addition, in particular embodiments, the child support may be adapted for gliding motion relative to the rocker's frame.

13 Claims, 2 Drawing Sheets

(51) Int. Cl.
  *C04B 35/628* (2006.01)
  *C04B 40/00* (2006.01)
  *C01B 31/02* (2006.01)
  *C01B 31/04* (2006.01)
  *B01J 37/02* (2006.01)
  *B01J 37/34* (2006.01)
  *B01J 21/18* (2006.01)
  *B01J 35/06* (2006.01)
  *A63G 17/00* (2006.01)
  *B01J 37/00* (2006.01)

(56) References Cited

U.S. PATENT DOCUMENTS

| | | | | |
|---|---|---|---|---|
| 5,522,773 | A * | 6/1996 | Rich | 472/114 |
| 5,690,383 | A * | 11/1997 | Meeker | 297/274 |
| 6,942,487 | B2 * | 9/2005 | Corbalis | 434/247 |
| D685,197 | S * | 7/2013 | Soriano et al. | D6/347 |

* cited by examiner

CHILDREN'S ROCKER

CROSS-REFERENCE TO RELATED APPLICATIONS

This patent application is a continuation of U.S. Nonprovisional application Ser. No. 13/532,130 entitled "Children's Rocker," filed Jun. 25, 2012, which claims the benefit of U.S. Provisional Application No. 61/500,652, filed Jun. 24, 2011, each of which is herein incorporated by reference in its entirety.

BACKGROUND OF THE INVENTION

1. Field of the Invention

Various embodiments of the present invention described herein generally relate to children's seating apparatuses, particularly children's seating apparatuses adapted for rocking and swinging motion.

2. Description of Related Art

Children's seating apparatuses commonly include a child support adapted for providing various types of motion in order to stimulate or soothe a child. As an example, conventional children's swings include a child support configured to oscillate along an arcuate path in order to entertain a child. In addition, conventional children's rockers include a child support configured to rock back and forth on a support surface in order to provide a calming or soothing sensation for a child. However, there remains an on-going need in the art for children's seating apparatuses that provide new and different types of motion suitable for entertaining or soothing a child. In addition, there remains a need in the art for a movable children's seating apparatus that is more easily propelled along its motion path by a child occupant.

BRIEF SUMMARY OF THE INVENTION

Various embodiments of the present invention are directed to a children's rocker apparatus. According to various embodiments, the children's rocker apparatus comprises a frame configured for rocking movement on a support surface, and a child support operatively connected to the frame and suspended above the support surface by one or more attachment members. In various embodiments, the one or more attachment members are configured to permit the child support to swing along a substantially arcuate path relative to the frame.

In certain embodiments, the one or more attachment members comprise a first set of one or more attachment members secured to a first lateral side of the frame and a second set of one or more attachment members secured to a second lateral side of the frame. In addition, the first set of one or more attachment members may be further secured to a first lateral side of the child support, and the second set of one or more attachment members may be further secured to a second lateral side of the child support. Moreover, in various embodiments, the first set of one or more attachment members may each be rotatably secured to the first lateral side of the frame and the second set of one or more attachment members may each be rotatably secured to the second lateral side of the frame, thereby permitting the first set of one or more attachment members and the second set of one or more attachment members to rotate relative to the frame as the child support swings along the arcuate path.

BRIEF DESCRIPTION OF THE SEVERAL VIEWS OF THE DRAWINGS

Reference will now be made to the accompanying drawings, which are not necessarily drawn to scale, and wherein.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Various embodiments of the present invention are directed to a children's rocker adapted for providing simultaneous rocking and swinging motion for a child positioned therein. According to various embodiments, the children's rocker generally comprises a frame configured for rocking movement on a support surface and a child support (e.g., a child seat) suspended from the frame by one or more attachment members. As described in greater detail herein, the attachment members are generally configured to permit the child support to swing along an arcuate path relative to the frame. In addition, in particular embodiments described herein, the child support may be adapted for gliding motion relative to the rocker's frame. In various embodiments, this combination of rocking and swinging motion has been found to be particularly entertaining for many children. In addition, the ability of children's rocker to both rock and swing enables a child occupant to more easily propel the child support along a motion path, thereby encouraging the child to practice walking and standing.

Children's Rocker

Figure 1:
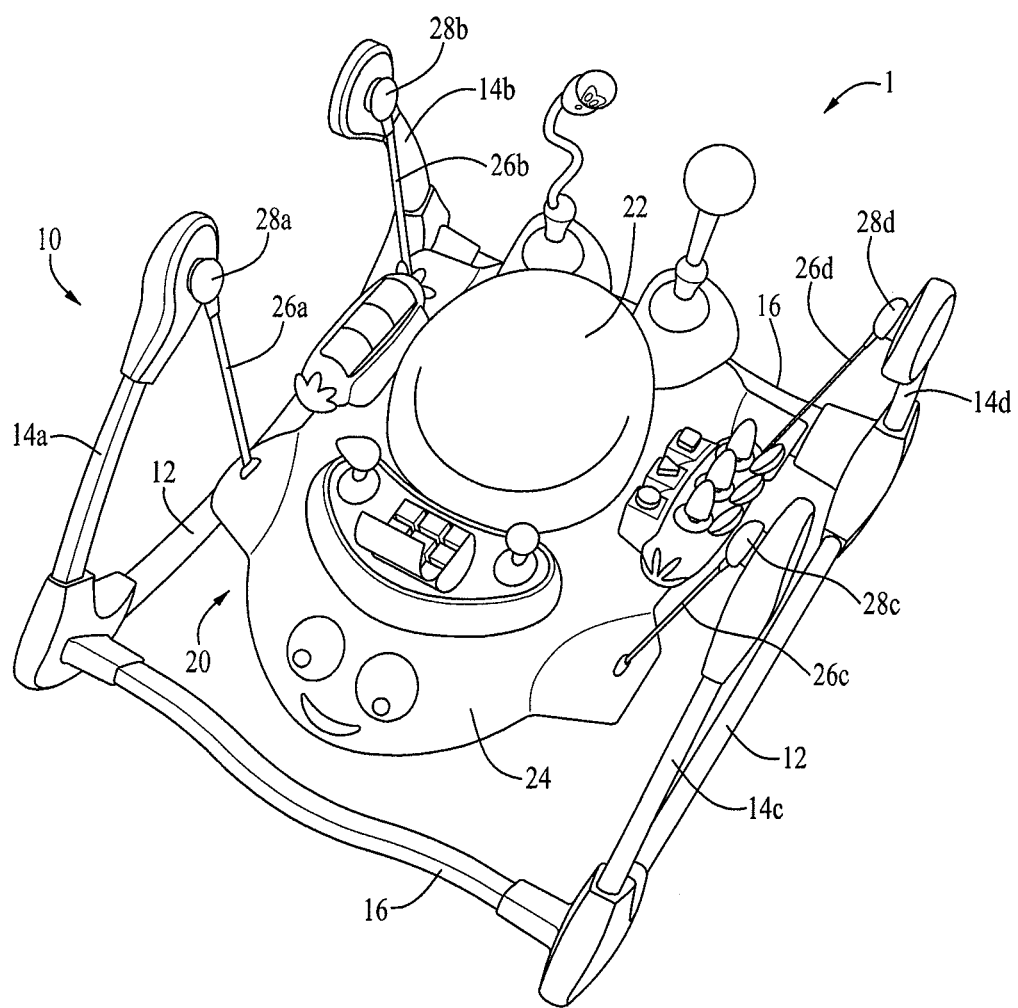
FIG. 1 shows an overhead perspective view of a children's rocker apparatus according to one embodiment of the present invention.

FIG. 1 illustrates a children's rocker 1 according to one embodiment of the present invention. As shown in FIG. 1, the children's rocker 1 generally comprises a rocking frame 10 and a child support 20 suspended from the rocking frame by a plurality of attachment members 26a-26d. In the illustrated embodiment, the rocking frame 10 comprises a pair of curved base members 12 spaced apart and connected to one another by cross members 16. Each of the base members 12 include a pair of support arms 14a-14d, which extend generally upwardly from front and rear portions of the base members 12.

The child support 20 comprises an activity frame 24 and a child seat 22 secured within the center of the activity frame 24. According to various embodiments, the activity frame 24 may include various toys, accessories, and other entertainment features. In various embodiments, the child seat 22 is configured for supporting a child above a support surface. In certain embodiments, the child seat 22 is configured such that the child's leg may extend downwardly from the seat 22, thereby permitting the child to stand and walk on the support surface. For example, in one embodiment, the child seat 22 may comprise a fabric sling suspended from a rotatable member secured within the center of the activity frame 24 and provided with leg holes permitting the child's legs to extend downwardly. However, according to various embodiments, the child seat 22 may comprise any suitable seat or support device capable of suspending a child positioned in the children's rocker 1 above a support surface (e.g., a rigid child seat disposed within the center of the activity frame 24).

In the illustrated embodiment of FIG. 1, the child support 20 is suspended from the rocking frame 10 by four attachment members 26a-26d. According to certain embodiments, the attachment members 26a-26d may each comprise a flexible member, such as a nylon cord or elastomeric band (e.g., made from thermoplastic or thermoset rubber). However, according to various embodiments, the attachment members 26a-26d may comprise any member suitable for suspending the child support 20 from the rocking frame 10 in the manner described herein, including—but not limited to—substantially rigid plastic members, non-elastomeric cords or bands, and mechanical springs.

As shown in FIG. 1, a first attachment member 26a and second attachment member 26b are secured at one of their ends to a first lateral side of the child support's activity frame 24, while their opposite ends are each secured to one of the support arms 14a, 14b positioned on a first lateral side of the rocking frame 10. Likewise, a third attachment member 26c and a fourth attachment member 26d are secured at one of their ends to a second lateral side of the child support's activity frame 24, while their opposite ends are each secured to one of the support arms 14c, 14d positioned on a second lateral side of the rocking frame 10. Together, the attachment members 26a-26d are configured to suspend the child support 20 above a support surface on which the rocking frame 10 is positioned.

In the illustrated embodiment, each of the four attachment members 26a-26d are rotatably secured to the rocking frame's support arms 14a-14d by pins 28a-28d. As such, each respective attachment member 26a-26d is configured to rotate about its respective pin 28a-28d and is thereby free to swing relative to the rocking frame 10. In particular, as shown in FIG. 1, the first attachment member 26a is attached to a frontal region of the child support's 20 first lateral side and is rotatably secured at its pin 28a to the front-most support arm 14a on the first lateral side of the rocking frame 10. Similarly, the second attachment member 26b is attached to a rear region of the child support's 20 first lateral side and is rotatably secured at its pin 28b to the rear-most support arm 14b on the first lateral side of the rocking frame 10. As such, the first attachment member 26a and second attachment member 26b are spaced apart from one another and pivot about different axes of rotation.

Likewise, the third attachment member 26c is attached to a frontal region of the child support's 20 second lateral side and is rotatably secured at its pin 28c to the front-most support arm 14c on the second lateral side of the rocking frame 10. The fourth attachment member 26d is attached to a rear region of the child support's 20 second lateral side and is rotatably secured at its pin 28d to the rear-most support arm 14d on the second lateral side of the rocking frame 10. As such, the third attachment member 26c and fourth attachment member 26d are also spaced apart from one another and pivot about different axes of rotation.

Figure 2:
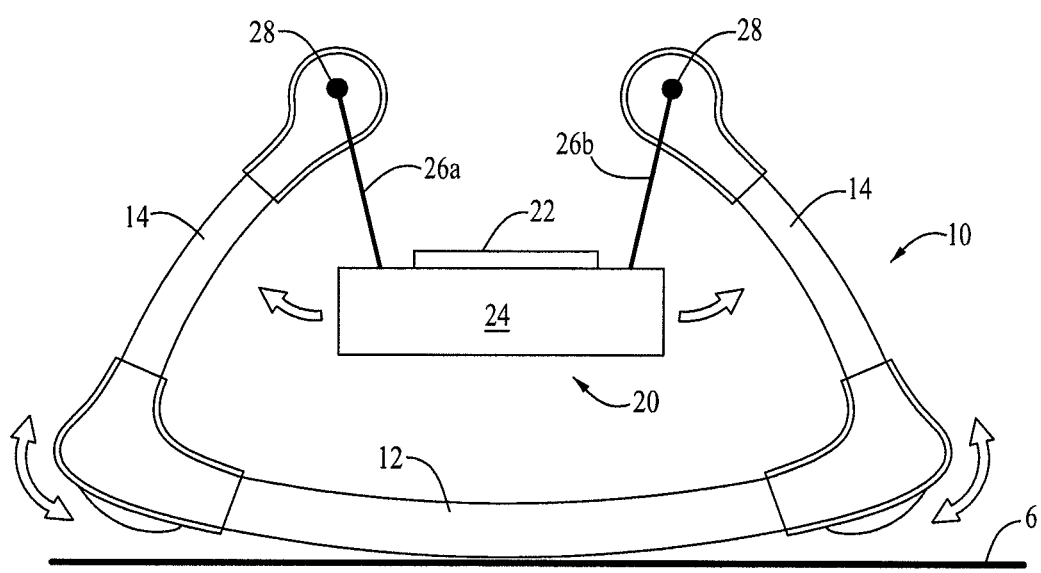
FIG. 2 shows a side cross-sectional view of a children's rocker apparatus according to one embodiment of the present invention.

FIG. 2 shows a cross-sectional side view of the children's rocker 1 positioned on a support surface 6 in which the first lateral side of the rocking frame 10 and child support 20 are shown. As will be evident from FIG. 2, the spaced apart relationship of the attachment members 26a-26d enables the child support 20 to glide back and forth along an arcuate path relative to the rocking frame 10. This motion is generally indicated by the directional arrows shown adjacent the child support 20 in FIG. 2.

In addition, as shown in FIG. 2 and as noted above, the base members 12 of the rocking frame 10 include a curved bottom surface configured to engage the support surface 6 and permit the frame 10 to rock back and forth along the support surface 6. This motion is generally indicated by the directional arrows adjacent the rocking frame 10 in FIG. 2. As such, a child positioned in the child support's seat 22 is able to experience a combination of rocking motion (e.g., derived from the movement of the rocking frame 10 along the support surface 6) and gliding motion (e.g., derived from the movement of the child support 20 relative to the rocking frame 10). In various embodiments, the combination of these motions provides and enhanced sensory effect for a child. In addition, the ability of the child support 20 to swing relative to the rocking frame 10, in combination with the rocking frame's 10 ability to rock along a support surface, reduces the magnitude of the motive force necessary to propel the child support 20 along a motion path and thereby makes it easier for a child occupant to propel the child support 20. As noted above, in embodiments in which the child support 20 is configured such that a child's legs may extend downwardly and engage the support surface, the reduced motive force encourages the child to practice walking and standing and may enhance the child's development of these skills Various Other Embodiments As will be appreciated from the description herein, various changes and modifications to the children's rocker 1 are contemplated as being within the scope of the present invention. For example, in certain embodiments the child support 20 may be adapted for traditional swinging motion (e.g., where the attachment members 26a-26d are secured to rocking frame 10 such that the child support 20 rotates about a single pin on each side of the rocking frame 10). In addition, according to various embodiments, the attachment members 26a-26d may be secured to the rocking frame 10 using any means suitable for permitting the above-described motion of the child support 20 (e.g., rotatable bearings, hook and loop features, etc.). Furthermore, the attachment members 26a-26d may be secured to the child support 20 using any suitable attachment means and may be secured at any combination of locations to the child support 20 capable of providing a stable suspension of the child support 20.

In addition, any number of attachment members may be used to suspend the child support 20 from the rocking frame 10 while achieving the motion characteristics described herein. For example, in certain embodiments, a single attachment member may be provided on either side of the child support 20 (e.g., where a single attachment member is secured at its ends to adjacent legs 14 and secured along its medial region to one or more portions of the child support 20). Moreover, in certain embodiments, the attachment members 26a-26d may be resilient (e.g., comprised of bungee cords or other elastomeric members) and configured such that the child support 20 may bounce relative to the rocking frame 10.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A children's rocker apparatus comprising:
   a frame configured for rocking movement on a support surface; and
   a child support operatively connected to the frame and suspended above the support surface by one or more attachment members, the one or more attachment members being configured to permit the child support to swing along a substantially arcuate path relative to the frame;
   wherein the one or more attachment members comprise a first set of one or more attachment members secured to a first lateral side of the frame and a second set of one or more attachment members secured to a second lateral side of the frame;
   wherein the first set of one or more attachment members are further secured to a first lateral side of the child support, and the second set of one or more attachment members are further secured to a second lateral side of the child support; and
   wherein the child support comprises a child seat supported by an child support frame, the first set of one or more attachment members being secured to a first lateral side of the child support frame and the second set of one or more attachment members being secured to a second lateral side of the child support frame.

2. The children's rocker apparatus of claim 1, wherein the child support is configured for gliding movement along the arcuate path.

3. The children's rocker apparatus of claim 1, wherein the first set of one or more attachment members are each rotatably secured to the first lateral side of the frame and the second set of one or more attachment members are each rotatably secured to the second lateral side of the frame, thereby permitting the first set of one or more attachment members and the second set of one or more attachment members to rotate relative to the frame as the child support swings along the arcuate path.

4. The children's rocker apparatus of claim 3, wherein the first set of one or more attachment members comprises a first attachment member and a second attachment member, the first attachment member and second attachment member being secured to the first lateral side of the child support and the first lateral side of the frame such that they are spaced apart from one another;
   wherein the second set of one or more attachment members comprises a third attachment member and a fourth attachment member, the third attachment member and fourth attachment member being secured to the second lateral side of the child support and the second lateral side of the frame such that they are spaced apart from one another; and
   wherein the first set of one or more attachment members and second set of one or more attachment members are configured to permit the child support to glide along the arcuate path relative to the frame.

5. The children's rocker apparatus of claim 1, wherein the child support is configured to support a child occupant such that the child's legs may extend downwardly and engage the support surface.

6. The children's rocker apparatus of claim 1, wherein the frame comprises one or more curved base portions configured for engaging the support surface and permitting the frame to rock reciprocally on the support surface.

7. The children's rocker apparatus of claim 1, wherein the one or more attachment members comprise substantially flexible members.

8. A children's rocker apparatus comprising:
   a frame configured for rocking movement on a support surface; and
   a child support operatively connected to the frame and suspended above the support surface by one or more attachment members, the one or more attachment members being configured to permit the child support to glide along a substantially arcuate path relative to the frame such that the orientation of the child support remains substantially horizontal with respect to the frame as it moves along the substantially arcuate path;
   wherein the one or more attachment members comprise a first set of one or more attachment members secured to a first lateral side of the frame and a second set of one or more attachment members secured to a second lateral side of the frame;
   wherein the child support comprises a child seat supported by a child support frame, and wherein the first set of one or more attachment members are further secured to a first lateral side of the child support frame and the second set of one or more attachment members are further secured to a second lateral side of the child support frame.

9. The children's rocker apparatus of claim 8, wherein the first set of one or more attachment members are each rotatably secured to the first lateral side of the frame and the second set of one or more attachment members are each rotatably secured to the second lateral side of the frame, thereby permitting the first set of one or more attachment members and the second set of one or more attachment members to rotate relative to the frame as the child support swings along the arcuate path.

10. The children's rocker apparatus of claim 8, wherein the first set of one or more attachment members comprises a first attachment member and a second attachment member, the first attachment member and second attachment member being secured to the first lateral side of the child support frame and the first lateral side of the frame such that they are spaced apart from one another;
    wherein the second set of one or more attachment members comprises a third attachment member and a fourth attachment member, the third attachment member and fourth attachment member being secured to the second lateral side of the child support frame and the second lateral side of the frame such that they are spaced apart from one another; and
    wherein the first set of one or more attachment members and second set of one or more attachment members are configured to permit the child support to glide along the arcuate path relative to the frame.

11. The children's rocker apparatus of claim 8, wherein the child support is configured to support a child occupant such that the child's legs may extend downwardly and engage the support surface.

12. The children's rocker apparatus of claim 8, wherein the frame comprises one or more curved base portions configured for engaging the support surface and permitting the frame to rock reciprocally on the support surface.

13. The children's rocker apparatus of claim 8, wherein the one or more attachment members comprise substantially flexible members.

* * * * *